United States Patent [19]

Kim

[11] Patent Number: 5,771,197
[45] Date of Patent: Jun. 23, 1998

[54] SENSE AMPLIFIER OF SEMICONDUCTOR MEMORY DEVICE

[75] Inventor: Jae-Hyeoung Kim, Seoul, Rep. of Korea

[73] Assignee: Hyundai Electronics Industries Co., Ltd., Kyoungki-do, Rep. of Korea

[21] Appl. No.: 882,310

[22] Filed: Jun. 25, 1997

[30] Foreign Application Priority Data

Jun. 29, 1996 [KR] Rep. of Korea ...................... 96-26331

[51] Int. Cl.$^6$ ..................................... G11C 7/00
[52] U.S. Cl. .......................... 365/210; 365/203; 365/205; 365/207
[58] Field of Search .................................... 365/210, 207, 365/203, 205

[56] References Cited

U.S. PATENT DOCUMENTS

| 4,951,256 | 8/1990 | Tobita ................................... 365/210 X |
| 5,062,079 | 10/1991 | Tsuchida et al. ........................ 365/210 |
| 5,243,573 | 9/1993 | Makihara et al. ....................... 365/205 |
| 5,528,543 | 6/1996 | Stiegler ................................. 365/210 X |

Primary Examiner—Do Hyon Yoo
Attorney, Agent, or Firm—Ware, Fressola, Van Der Sluys & Adolphson LLP

[57] ABSTRACT

A sense amplifier of a semiconductor memory device includes: a precharge section for precharging the dummy line and bit line with a required voltage by means of an equalizer signal transferred from an external; a data sensing section for receiving and latching voltage of the bit line and voltage of the dummy lines as first and second input signals, respectively, by means of a sense amplifier enable signal transferred from the external, thereby sensing data from the memory cell and generating it as an output signal; a precharge enable section for disabling the precharge section by means of the sense amplifier enable signal transferred from the external when in a data sensing operation or for enabling the precharge section when not in a data sensing operation; and a data sensing enable section for transmitting the voltage of the bit line and the voltage of dummy line as first and second input signals, respectively, to the data sensing section according to the sense amplifier enable signal from the external depending on data from the memory cell.

7 Claims, 3 Drawing Sheets

SENSE AMPLIFIER OF SEMICONDUCTOR MEMORY DEVICE

BACKGROUND OF THE INVENTION

1. Field of the Invention

The present invention relates to a sense amplifier of a semiconductor memory device and, more particularly, to a sense amplifier of a mask ROM using the latch characteristic of a CMOS inverter with high speed and low power consumption.

2. Discussion of Related Art

A nonvolatile memory device is a storage element that retains information when power is off. Examples of the nonvolatile memory devices include: mask ROM; programmable and readable EPROM; EEPROM; and flash EEPROM.

A mask ROM is a read-only memory device for storing and reading out one bit information in a cell transistor, usually used in office automatization equipments such as electronic pocketbook and printers, or video game cartridges requiring high speed execution.

FIG. 1 is a block diagram showing a conventional mask ROM. Referring to FIG. 1, the mask ROM includes: a memory cell array 6 having a plurality of memory cells arranged in a plurality of word and bit lines thereof of the memory cell array; an address input buffer 1 for temporarily storing address signals received from an external; a X-predecoder circuit 2 and a X-decoder circuit 3 to decode row address signals received from the address input buffer 1 and to select a corresponding word line from the plurality of the word lines in the memory cell array 6; and a Y-predecoder circuit 4 and a Y-decoder circuit 5 to decode column address signals received from the address input buffer 1 and to select a corresponding bit line out of a plurality of the bit lines in the memory cell array 6.

The mask ROM further includes: an address transition detection section 7 to detect the transition of address signals transferred from the address input buffer 1; a sense amplifier 8 to sense and amplify information from the memory cell array 6 according to a sense amplifier enable signal SE from the address transition detection section 7; and an output buffer 9 to receive output data SAout of the sense amplifier 8 and generate it as output data Dout of the mask ROM.

The operation of the mask ROM as constructed above is described below. Once the external address signals are transferred into the X-predecoder circuit 2 and X-decoder circuit 3 via the address input buffer 1, the decoder circuits decode row address signals of the address signals and transmit a decoding signal to the memory cell array 6 for selecting a corresponding word line of a plurality of the word lines in the memory cell array 6.

At the same time, the Y-predecoder circuit 4 and Y-decoder circuit 5 decode the column address signals of the address signals received through the address input buffer 1, and transmit to the memory cell array a decoding signal for selecting a corresponding bit line of a plurality of the bit lines in the memory cell array 6.

The address transition detection section 7 detects the transition of the address signals received form the address input buffer 1 to output a sense amplifier enable signal SE to the sense amplifier 8. The sense amplifier 8 which is enabled with the sense amplifier enable signal SE senses and amplifies information from the selected memory cell of the memory cell array 6 and then transmit the sensed and amplified information SAout to the output buffer 9. The information SAout is then output through the output buffer 9 as an output data Dout of the mask ROM.

The sense amplifier 8 senses a low current from a memory cell selected by the decoding signals of the X-decoder circuit 3 and Y-decoder circuit 5, and converts it into a voltage signal. There are two types of sense amplifiers, a differential sense amplifier and a cross-coupled latch sense amplifier. In particular, the differential sense amplifier using a current mirror is characterized by favorable gain and high speed.

FIG. 2 is a circuit diagram of a conventional differential sense amplifier. As shown in FIG. 2, the differential sense amplifier includes: a precharge circuit 10 for precharging a dummy line 14 connected to a dummy cell 12 and a bit line 13 connected to a memory cell 11, with a required voltage by means of an equalizer signal /EQ received form an equalizer (not shown); and a data sensing circuit 20 being enabled with the sense amplifier enable signal SE and generating an output signal SAout from the voltage difference between the dummy line 14 and bit line 13, wherein the voltage difference is generated according to information of the memory cell 11.

The dummy cell 12 is of the same type as the memory cell 11. The dummy cell, however, has twice as many string cells as the memory cell 11 so as to permit a current, half as much in magnitude as that of the memory cell 11, to flow to the dummy cell. Accordingly, in the case that the dummy cell 12 has thirty-two NAND string cells, the memory cell would have sixteen NAND string cells.

The precharge circuit 10 has first and second precharge means to precharge the bit line 13 and dummy line 14 with a required voltage, respectively, through a common mechanism.

The first precharge means includes: first and second PMOS transistors PT11 and PT12 arranged in series to precharge the bit line 13 with a required voltage by means of the equalizer signal /EQ; and a third PMOS transistor PT13 to precharge the bit line 13 with a required voltage. The second precharge means includes: fourth and fifth PMOS transistors PT14 and PT15 in series to precharge the dummy line 14 with a required voltage by means of the equalizer signal /EQ; and a PMOS transistor PT16 to precharge the dummy line 14 with a required voltage.

The data sensing circuit 20 includes: a current mirror having seventh and eighth PMOS transistors PT21 and PT22 to permit a constant current to flow the dummy line 14 and bit line 13, and a sensing means for sensing data transferred from the memory cell 11 via the bit line 13. The sensing means includes: first and second NMOS transistors NT21 and NT22 connected to the precharge circuit 10 to perform a differential amplification of the voltage difference between the bit line 13 and the dummy line 14 according to the data of the memory cell; and a third NMOS transistor NT23 enabled by the sense amplifier enable signal SE to drive the first and second NMOS transistors NT21 and NT22.

A conventional sense amplifier also has NMOS transistors NT24 and NT25 acting as pass transistors driven by a reference voltage Vref applied from a reference voltage generator (not shown in the drawing) and connected to the bit line 13 and dummy line 14, respectively; and ninth and tenth PMOS transistors PT23 and PT24 connected in parallel to the first and second NMOS transistors NT21 and NT22 acting as a current mirror, respectively.

In the conventional sense amplifier as constructed above, the first and second PMOS transistors PT11 and PT12 of the bit line 13 and the third and fourth PMOS transistors PT14 and PT15 for the dummy line 14 of the precharge circuit 10 are turned on by the equalizer signal /EQ transferred out of the equalizer. Thus the bit line 13 and dummy line 14, i.e., nodes 'a' and 'b' are precharged with a required voltage.

During a data sensing operation, the NMOS transistor NT23 is turned on by the sense amplifier enable signal SE to enable the data sensing circuit 20. The data sensing circuit 20 carries out a differential amplification of the voltage difference between the bit line 13 and dummy line 14 according to the data in the memory cell 11 through the first and second NMOS transistors NT21 and NT22. The signal differentially amplified is generated as the output signal SAout of the data sensing circuit 20 through an inverter 15.

In the conventional sense amplifier to sense the data of the bit lines 13, the seventh and eighth PMOS transistors PT21 and PT22 of a current mirror are connected in parallel to the ninth and tenth PMOS transistors PT23 and PT24, respectively, so as to increase gain.

The sense amplifier, however, has a problem in that a large amount of current flows continuously through the ninth and tenth PMOS transistors PT23 and PT24 for increasing gain and the third NMOS transistor NT23, when the NMOS transistor NT23 is enabled by means of the sense amplifier enable signal SE.

In the conventional sense amplifier, the seventh and eighth PMOS transistors PT21 and PT22 of a current mirror and the ninth and tenth PMOS transistors PT23 and PT24 for increasing gain are weakly turned on. The first and second NMOS transistors NT21 and NT22 connected to the bit line 13 and dummy line 14 are also turned on. Thus, current will keep flowing through the PMOS transistors and NMOS transistors which are concurrently turned on.

Another problem of the prior art is excessive power consumption which is caused by a full swing voltage not being applied to the input of the inverter 15 which inverts the electric potential of a node c to generate it as the output signal SAout of the sense amplifier.

SUMMARY OF THE INVENTION

Accordingly, the present invention is directed to a sense amplifier of a semiconductor memory device that substantially obviates one or more of the problems due to limitations and disadvantages of the related art.

An object of the present invention is to provide a sense amplifier of a semiconductor memory device which can sense data and generate a full swing output voltage by using the latch characteristic of a CMOS inverter with high speed and low power consumption.

Another object of the present invention is to provide a sense amplifier of a semiconductor memory device for preventing excessive power consumption by turning off a precharge circuit during a data sensing operation.

To achieve these objects and other advantages and in accordance with the purpose of the present invention, as embodied and broadly described, a sense amplifier of a semiconductor memory device which senses voltage difference between a dummy line connected to a dummy cell and a bit line connected to a memory cell, includes: a precharge section for precharging the dummy line and bit line with a required voltage by means of an equalizer signal transferred from an external; a data sensing section for receiving and latching the voltage of the bit lines and dummy lines as first and second input signals, respectively, by means of a sense amplifier enable signal transferred from the external, thereby sensing data from the memory cell and generating as an output signal; a precharge enable section for disabling the precharge section by means of the sense amplifier enable signal transferred from the external when in a data sensing operation, or enabling the precharge section when not in a data sensing operation; and a data sensing enable section for transmitting the voltage of the bit line and the voltage of the dummy line as first and second input signals, respectively, to the data sensing section according to the sense amplifier enable signal from the external depending on data from the memory cell.

In addition, in the sense amplifier, the precharge enable section includes a PMOS transistor having a source to which a voltage from a power source is applied, a gate to which the sense amplifier enable signal from external is applied, and a drain connected to the data sensing section.

The data sensing enable section includes: a first enable means for transmitting the voltage of the bit line according to the memory cell's data as the first input signal of the data sensing section by means of the sense amplifier enable signal; and a second enable means for transmitting the voltage of the dummy line as the second input signal of the data sensing section by means of the sense amplifier enable signal.

Moreover, the first enable means of the data sensing enable section includes a first NMOS transistor having a gate to which the sense amplifier enable signal is applied, and a source connected to the data sensing section and a drain connected to the bit line, thereby transmitting the voltage of the bit line according to the memory cell's data as the first input signal of the data sensing section. The second enable means of the data sensing enable section includes a second NMOS transistor having a gate to which the sense amplifier enable signal is applied, a drain connected to the dummy line, and a source connected to the data sensing section, thereby transmitting the voltage of the dummy line as the second input signal of the data sensing section.

In the sense amplifier according to the present invention, the data sensing section also includes: a first CMOS inverter receiving the first input signal through the data sensing enable section and connected in series between a voltage source and a ground; and a second CMOS inverter receiving the second input signal through the data sensing enable section and connected in series between the voltage source and the ground.

Furthermore, the output signals of the first and second CMOS inverters in the data sensing section is fed back by means of different input signals, thereby latching the first and second input signals transferred from the data sensing enable section.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention, wherein.

DETAILED DESCRIPTION OF PREFERRED EMBODIMENT

Reference will now be made in detail to the preferred embodiments of the present invention, examples of which are illustrated in the accompanying drawings.

Figure 3:
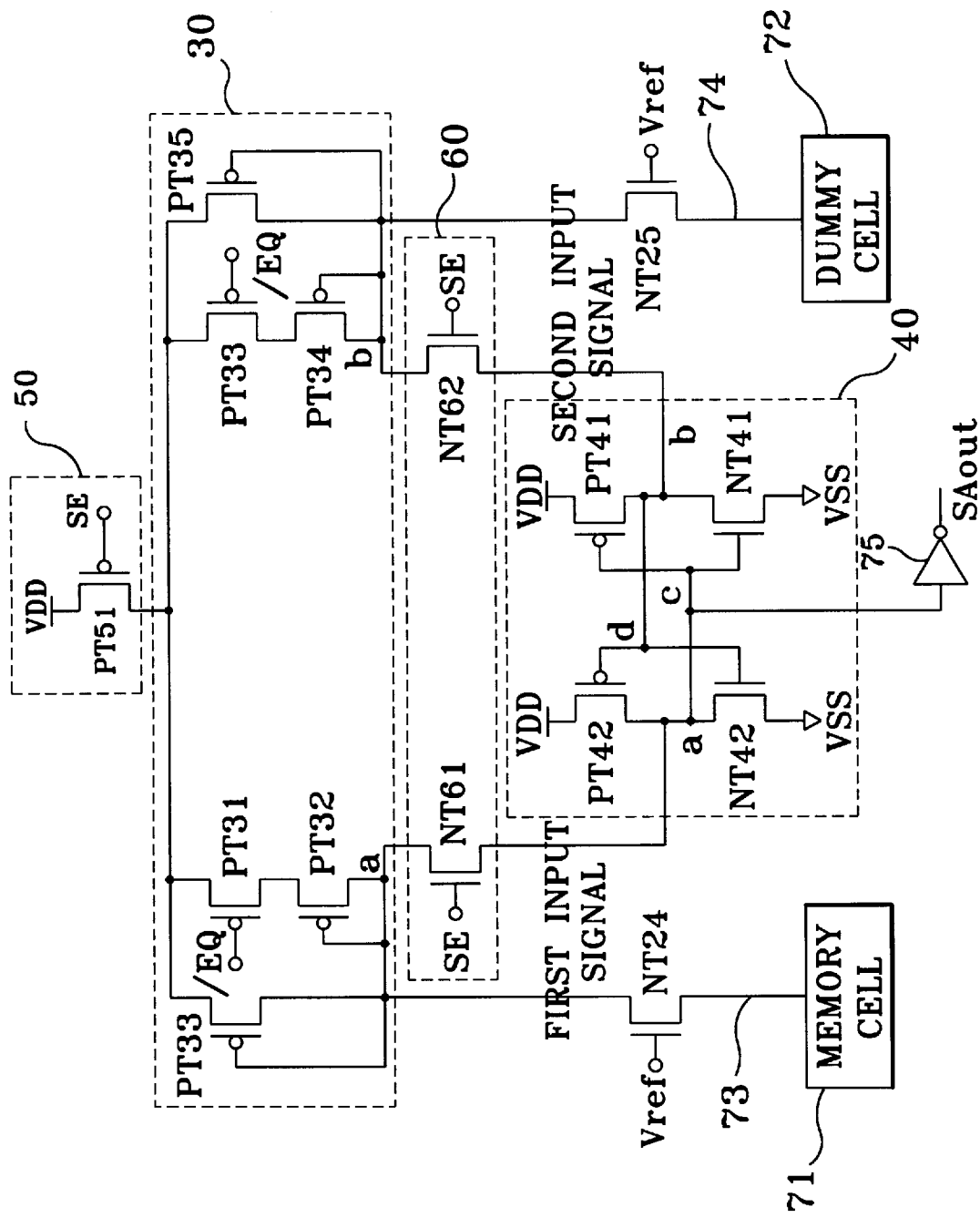
FIG. 3 is a detailed circuit diagram of a sense amplifier in a mask ROM according to an embodiment of the present invention.

Referring to FIG. 3, a sense amplifier of a mask ROM of the present invention includes: a precharge circuit 30 to precharge a bit line 73 connected to a memory cell 71 and a dummy line 74 connected to a dummy cell 72, with a required voltage by means of an equalizer signal /EQ received from an equalizer (not shown); and a data sensing circuit 40 to sense the data of the memory cell 71, with the voltage of the bit line 73 and the voltage of the dummy line 74 as first and second input signals, respectively, thereby generating the sensed data as output signal SAout.

The sense amplifier further comprises: a precharge enable section 50 for either disabling the precharge circuit 30 during the data sensing operation of the data sensing circuit 40, or enabling the precharge circuit 30 so as to precharge the bit line 73 and the dummy line 74 with a required voltage when the data sensing circuit 40 is not in operation, according to the sense amplifier enable signal; and a data sensing enable section 60 to transfer the voltage of the bit line 73 and the voltage of the dummy line 74 as first and second input signals to the data sensing circuit 40, according to the data of the memory cell 71.

Figure 1:
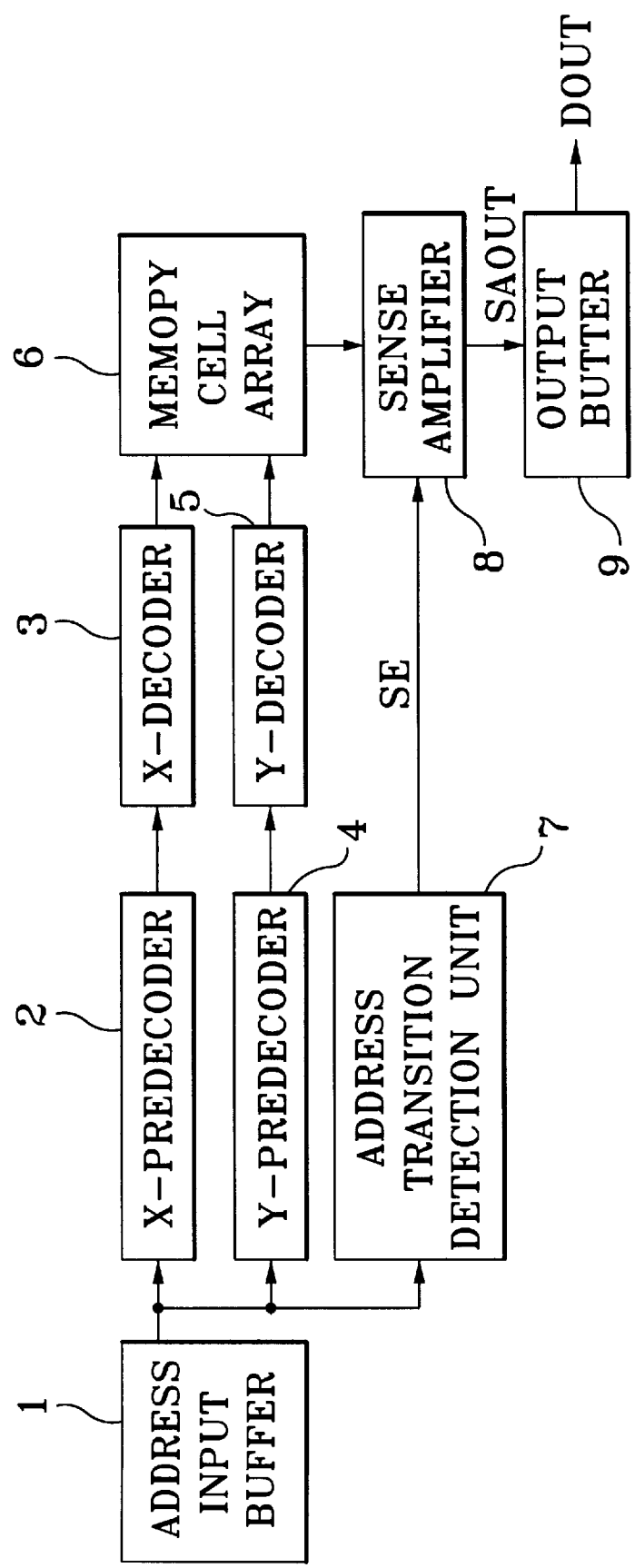
FIG. 1 is a block diagram of a conventional mask ROM.
Figure 2:
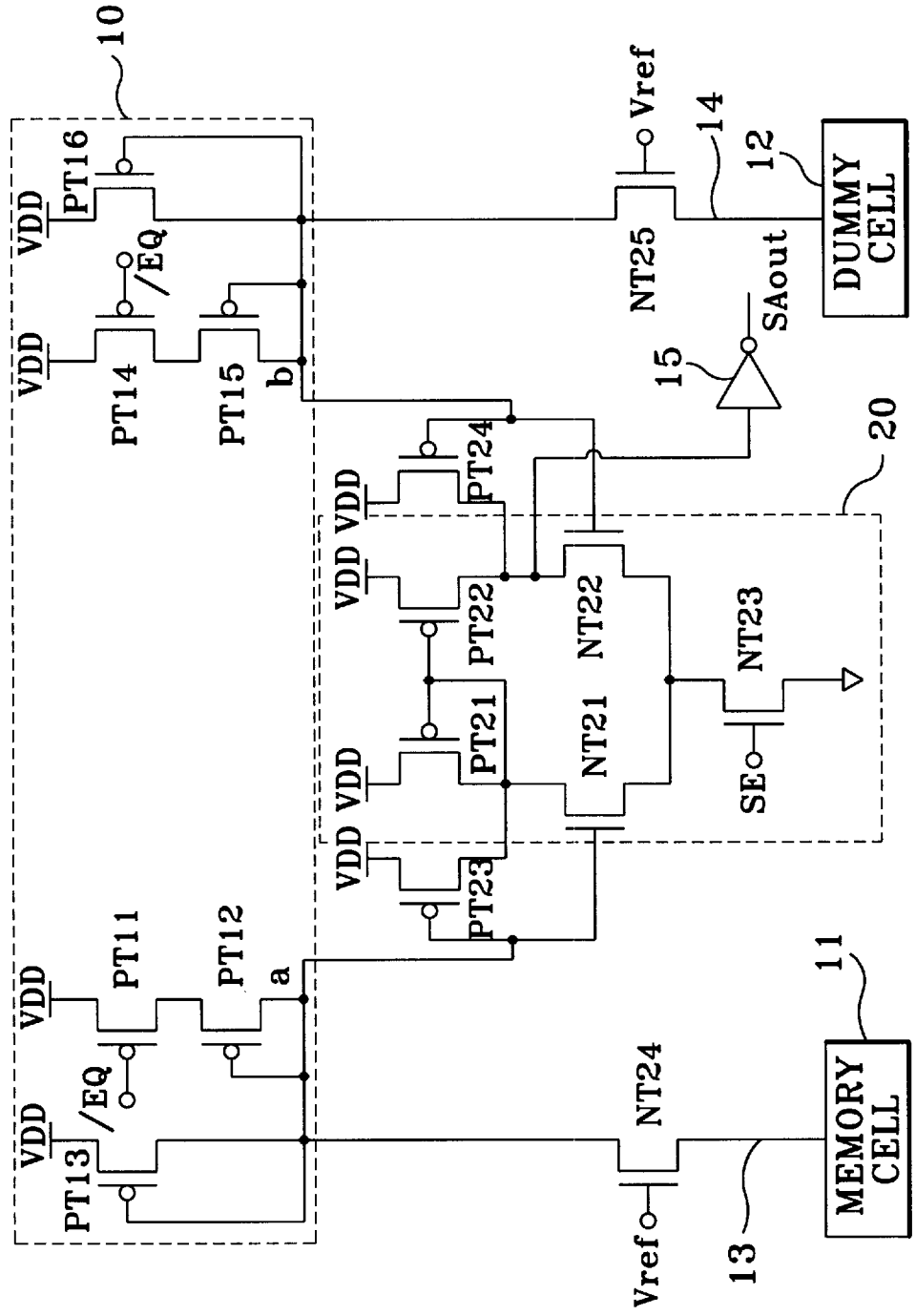
FIG. 2 is a detailed circuit diagram of a sense amplifier in the conventional mask ROM of FIG. 1.

In the sense amplifier of the present embodiment, the precharge circuit 30 is constructed in the same manner of the precharge circuit as shown in FIG. 1, including: first, second and third PMOS transistors PT31, PT32 and PT33 for precharging the bit line 73 with a required voltage by means of an equalizer signal /EQ received from an external; and forth, fifth and sixth PMOS transistors PT34, PT35 and PT36 for precharging the dummy line 74 with a required voltage by means of the equalizer signal from the external. At this time, the precharge circuit 30 is disabled or enabled by the precharge enable section 50.

The data sensing circuit 40, receiving a first input signal as a gate input signal which is the voltage of the bit line 73 applied through the data sensing enable unit 60, includes: a first CMOS inverter including a seventh PMOS transistor PT41 and a first transistor NT41 connected in series between a power source $V_{DD}$ and a ground $V_{SS}$, the seventh transistor PT41 and the first transistor NT41 receiving a first input signal as a gate input signal that is the voltage of the bit line 73 applied through the data sensing enable section 60; and a second CMOS inverter including an eighth PMOS transistor PT42 and a second NMOS transistor NT42 connected in series between the power source $V_{DD}$ and ground $V_{SS}$, the second CMOS inverter receiving a second input signal as a gate input signal that is the voltage of the dummy line 74 applied through the data sensing enable section 60, to generate a data output signal SAout.

Referring to FIG. 3, the output signals of the first and second CMOS inverters are fed back by the output signals from CMOS transistors to latch the first and second input signals transmitted through the data sensing enable unit 60.

The precharge enable unit 50 includes: a ninth PMOS transistor PT51 having a source to which a voltage from the power source $V_{DD}$ is applied, a gate to which a sense amplifier enable signal SE is applied, and a drain connected to the precharge circuit 30.

When the sense amplifier enable signal SE is low, the precharge enable unit 50 enables the precharge circuit 30 to precharge the bit line 73 and the dummy line 74 with a required voltage by turning on the PMOS transistor PT51 to apply the voltage from the power source $V_{DD}$ to the precharge circuit 30. If the sense amplifier enable signal SE is high, the PMOS transistor PT51 is turned off to interrupt the voltage from the source $V_{DD}$, so that the precharge circuit 30 cannot precharge the bit line 73 and the dummy line 74.

The data sensing enable section 60 includes: a first enable means for applying the voltage of the bit line 73 according to the data of the memory cell 71 as the first input signal of the data sensing circuit 40 by the sense amplifier enable signal SE; and a second enable means for applying the voltage of the dummy line 74 as the second input signal of the data sensing circuit 40 by the sense amplifier enable signal SE.

The first enable means of the data sensing enable section 60 includes: a third NMOS transistor NT61 having a gate to which the sense amplifier enable signal SE is applied, a drain connected to the bit line 73, and a source connected to the data sensing circuit 40. Therefore, through the first enable means, the voltage of the bit line 73 according to the data of the memory cell 71 is transmitted as the first input signal of the data sensing circuit 40 by means of the sense amplifier enable signal SE.

The second enable means of the data sensing enable section 60 includes: a fourth NMOS transistor NT62 having a gate to which the sense amplifier enable signal SE is applied, a drain connected to the dummy line 74, and a source connected to the data sensing circuit 40. Accordingly, the voltage of the dummy line 74 is transmitted through the second enable means as the second input signal of the data sensing circuit 40 by means of the sense amplifier enable signal SE.

The operation of the sense amplifier as constructed above is described below.

Without a sense operating period for sensing the memory cell's data through the data sensing circuit 40, the sense amplifier enable signal SE transferred from the external becomes low and is fed into the precharge section 50 and the data sensing enable section 60. Thus, the PMOS transistor PT51 of the precharge enable section 50 is driven by the sense amplifier enable signal SE to apply the voltage of the power source $V_{DD}$ to the precharge section 30. The precharge section 30 precharges the bit line 73 and the dummy line 74 with a required voltage by means of an equalizer signal /EQ from the external.

The data sensing enable section 60 prevents the first and second input signals which are the voltage of the bit line 73 and the voltage of the dummy line 74 from being fed into the data sensing section 40 by turning off both NMOS transistors NT61 and NT62 through the sense amplifier enable signal SE, so that the data sensing section 40 cannot perform the data sensing operation.

On the other hand, the precharging operation does not work in a sense operating area for sensing the memory cell's data through the data sensing circuit 40 because the sense amplifier enable signal SE transferred from the external becomes high. The PMOS transistor PT51 of the precharge enable section 50 is therefore turned off so as to interrupt the voltage from power source $V_{DD}$ to the precharge section 30.

The data sensing enable section 60 turns on the NMOS transistors NT61 and NT62 by means of the sense amplifier enable signal SE, so that the voltage of the bit line 73 and the voltage of the dummy line 74 are fed into the data sensing section 40 as the first and second input signals.

The data sensing circuit 40 receives the first and second input signals transferred through the data sensing enable section 60 to sense-amplify the data of the memory cell and generate the output signal SAout through an inverter 75.

For example, if the voltage of the bit line 73 is higher than that of the dummy line 74 according to the memory cell's data, the potential of a node 'a' becomes higher than that of a node 'b'. In other words, if the first input signal is high but the second is low, the NMOS transistor NT41 of a first inverter is turned on by the first input signal and the PMOS transistor PT42 is turned on by the second input signal, so that a node 'd' becomes low and a node 'c' is high.

The output signal of the second CMOS inverter which exists in high level is generated as the output signal SAout through the inverter 75. The output signals of the first and second CMOS inverters are fed back by the input signals of the different CMOS inverters, thus latching the voltages of the nodes 'c' and 'd' at high and low levels, respectively.

When the voltage of the bit line 73 is less than that of the dummy line 74 according to the memory cell's data, the potential of the node 'a', becomes lower than that of the node 'b'. In other words, the first input signal is high but the second input signal is low. The NMOS transistor NT42 of the second CMOS inverter is turned on by the second input signal, and the PMOS transistor PT42 of the first inverter is turned on by the first input signal, so that the nodes 'c' and 'd' become low and high, respectively.

The output of the second inverter which exists at a low level is generated as the output signal SAout through the inverter 75. The output signals of the first and second CMOS inverters are fed back by the input signals of the different CMOS inverters, thus latching the voltages of the nodes 'c' and 'd' at low and high levels, respectively.

According to the above sense amplifier of the present invention, the data sensing circuit 40 consists of a high speed CMOS inverter to perform a rapid data sensing operation, thereby ouputting the sensed data through the inverter 75.

A full swing voltage can be applied to the inverter 75 because the PMOS transistor PT41 and the NOS transistor NT41 in the first CMOS inverter, or the PMOS transistor PT42 and the NOS transistor NT42 in the second CMOS inverter are not concurrently turned on.

Furthermore, in the sense amplifier of the present invention, the precharge enable section 50 controls precharge circuit 30. When the data sensing operation does not occur, the power voltage being fed into the precharge section is interrupted by the precharge enable section 50 so as to disable the precharging operation. Accordingly, the PMOS transistor is prevented from being turned on so that current does not flow to the PMOS transistor.

According to the present invention, the sense amplifier senses memory cell data using a high speed CMOS inverter with high speed. In addition PMOS and NMOS transistors are prevented from being turned on concurrently so that a full swing voltage can applied to the output inverter.

It will be apparent to those skilled in the art that various modifications and variations can be made in the sense amplifier of a semiconductor memory device of the present invention without departing from the spirit or scope of the invention. Thus, it is intended that the present invention cover the modifications and variations of this invention provided they come within the scope of the appended claims and their equivalents.

What is claimed is:

1. A sense amplifier of a semiconductor memory device which senses voltage difference between a dummy line connected to a dummy cell and a bit line connected to a memory cell, the sense amplifier comprising:

a precharge section for precharging the dummy line and the bit line with a required voltage by means of an equalizer signal transferred from an external;

a data sensing section for receiving and latching voltage of the bit line and voltage of the dummy line as first and second input signals, respectively, by means of a sense amplifier enable signal transferred from the external, thereby sensing data from the memory cell and generating an output signal;

a precharge enable section for disabling the precharge section by means of the sense amplifier enable signal transferred from the external when in a data sensing operation or for enabling the precharge section when not in the data sensing operation; and a data sensing enable section for transmitting the voltage of the bit line and the voltage of the dummy line as the first and second input signals, respectively, to the data sensing section according to the sense amplifier enable signal from the external depending on the data from the memory cell.

2. The sense amplifier as defined in claim 1, wherein the precharge enable section comprises a PMOS transistor having a source to which a voltage from a power source is applied, a gate to which the sense amplifier enable signal from the external is applied, and a drain connected to the precharge section.

3. The sense amplifier as defined in claim 1, wherein the data sensing enable section comprises:

a first enable means for transmitting the voltage of the bit line according to the data from the memory cell as the first input signal of the data sensing section by means of the sense amplifier enable signal; and a second enable means for transmitting the voltage of the dummy line as the second input signal of the data sensing section by means of the sense amplifier enable signal.

4. The sense amplifier as defined in claim 3, wherein the first enable means of the data sensing enable section comprises a first NMOS transistor having a gate to which the sense amplifier enable signal is applied, and a source connected to the data sensing section and a drain connected to the bit line, thereby transmitting the voltage of the bit line according to the data from the memory cell as the first input signal of the data sensing section.

5. The sense amplifier as defined in claim 4, wherein the second enable means of the data sensing enable section comprises a second NMOS transistor having a gate to which the sense amplifier enable signal is applied, a drain connected to the dummy line, and a source connected to the data sensing section, thereby transmitting the voltage of the dummy line as the second input signal of the data sensing section.

6. The sense amplifier as defined in claim 1, wherein the data sensing section comprises:

a first CMOS inverter receiving the first input signal through the data sensing enable section and connected in series between a voltage source and a ground; and a second CMOS inverter receiving the second input signal through the data sensing enable section and connected in series between the voltage source and the ground.

7. The sense amplifier as defined in claim 6, wherein the output signals of the first and second CMOS inverters in the data sensing section are fed back by means of different input signals, thereby latching the first and second input signals transferred from the data sensing enable section.

* * * * *